(12) United States Patent
Kawanabe

(10) Patent No.: US 6,714,360 B2
(45) Date of Patent: Mar. 30, 2004

(54) LENS DEVICE AND METHOD OF ASSEMBLY OF LENS DEVICE

(75) Inventor: Yuichi Kawanabe, Saitama (JP)

(73) Assignee: Fuji Photo Optical Co., Ltd., Saitama (JP)

( * ) Notice: Subject to any disclaimer, the term of this patent is extended or adjusted under 35 U.S.C. 154(b) by 10 days.

(21) Appl. No.: 10/388,545

(22) Filed: Mar. 17, 2003

(65) Prior Publication Data

US 2003/0184880 A1 Oct. 2, 2003

(30) Foreign Application Priority Data

Mar. 29, 2002 (JP) ......................................... 2002-095446

(51) Int. Cl.[7] .............................................. G02B 15/14
(52) U.S. Cl. ........................ 359/704; 359/694; 396/542
(58) Field of Search ................................. 359/813, 819, 359/815, 822, 826, 827, 704, 694; 396/542, 532; 361/749, 752, 756, 758

(56) References Cited

U.S. PATENT DOCUMENTS 5,461,443 A  * 10/1995 Nakayama et al. ........... 396/89
5,572,374 A  * 11/1996 Okada et al. ................ 359/827
5,739,962 A  * 4/1998 Asakura et al. ............. 359/700
2002/0135901 A1 * 9/2002 Nomura et al. ............. 359/819

FOREIGN PATENT DOCUMENTS

| JP | H4-22332 | 5/1992 |
| JP | 2001-235667 | 8/2001 |

* cited by examiner

*Primary Examiner*—Jordan M. Schwartz
*Assistant Examiner*—Jessica Stultz
(74) *Attorney, Agent, or Firm*—Arnold International; Jon W. Henry; Bruce Y. Arnold

(57) ABSTRACT

A lens device for mounting a flexible printed circuit board in a lens barrel and method of assembling the flexible printed circuit board in the lens barrel of the lens device is disclosed. The lens device includes a through-channel on a portion of the lens barrel. The through-channel includes first and second tiers formed by a first partition and a second partition that is perpendicular to the first partition which divides the second tier into separate through-channels. The flexible printed circuit board is assembled in the lens device by inserting the flexible printed circuit board into the first tier from one end of said through-channel, folding the flexible printed circuit board at the other end of the through-channel into a folded part, and inserting the folded part of the flexible printed circuit board into one of the separate through-channels of the second tier from the other end of the through-channel.

20 Claims, 16 Drawing Sheets

LENS DEVICE AND METHOD OF ASSEMBLY OF LENS DEVICE

BACKGROUND OF THE INVENTION

Recent lens devices of electronic still cameras are provided with an actuator in the lens barrel in order to obtain the required compactness. Such lens devices use a flexible printed circuit board to connect a unit including a shutter to the control part of the camera body so that the shutter and diaphragm are controlled from the camera body. The flexible printed circuit board is provided in a lens barrel with a loop structure so that it can tolerate shifts due to zooming and retraction of the lens barrel. The loop structure is positioned within a through-channel formed in the lens barrel so as to prevent problems associated with shifting.

In general, the flexible printed circuit board has a band shape with both ends wider than the center part that provides a connecting structure. A through-channel formed in the lens barrel has nearly the same width as the connection ends so that the ends of the flexible printed circuit board can be inserted into the channel. However, the through-channel having nearly the same width as the connection ends of the flexible printed circuit board allows the center part of the flexible printed circuit board to have crosswise play. This causes problems with the shifting of the loop.

In order to prevent these problems, as shown in FIG. 16, a partition 93 having a certain height is conventionally provided in the through-channel 92 formed in the lens barrel 91. The partition 93 regulates the crosswise movement of the flexible printed circuit board. The partition 93 is formed in the through-channel 92, leaving a space 94 that allows the connection ends of the flexible printed circuit board to pass. The connection ends are inserted through the space 94 and the partition 93 prevents crosswise movements of the inserted flexible printed circuit board.

Instead of inserting the flexible printed circuit board in a through-channel so as to prevent problems, Examined Japanese Utility Model H04-22332 uses a separate guide mechanism for the flexible printed circuit board to prevent the problems of the flexible printed circuit board. Japanese Laid-Open Patent Application 2001-235667 describes an alternative structure in which a partition is provided after the flexible printed circuit board is inserted in the through-channel.

In a method in which a partition is provided in the through-channel to prevent crosswise movement of the flexible printed circuit board is shown in FIGS. 17A–17C. However, the loop may be caught by the top or step 93a of the partition 93 or may be trapped in the space when it shifts. This may damage the flexible printed circuit board 60. In addition, passing the connection ends through a narrow space makes the assembly process difficult.

The prior art structure, as shown in FIGS. 16 and 17A–17C, is designed based on the idea that the loop 60d of the flexible printed circuit board 60 will stay in the space 94 as shown in FIG. 17B. However, the loop 60d may occasionally come out of the space 94 of the through-channel 92 as shown in FIG. 17C. That results in problems with the flexible printed circuit board 60. Alternatively, using a separate guide mechanism for the flexible printed circuit board disadvantageously increases the size of the lens device. Providing a partition after the flexible printed circuit board is inserted is not preferred because this increases the number of assembly steps.

BRIEF SUMMARY OF THE INVENTION

The present invention is related to a lens device in which a flexible printed circuit board can be easily assembled and to a method of assembling the flexible printed circuit board in the lens device. In particular, the present invention relates to a lens device that can be used with a camera having a retractable lens barrel.

BRIEF DESCRIPTION OF THE DRAWINGS

The present invention will become more fully understood from the detailed description given below and the accompanying drawings, which are given by way of illustration only and thus are not limitative of the present invention, wherein.

DETAILED DESCRIPTION

Figure 1:
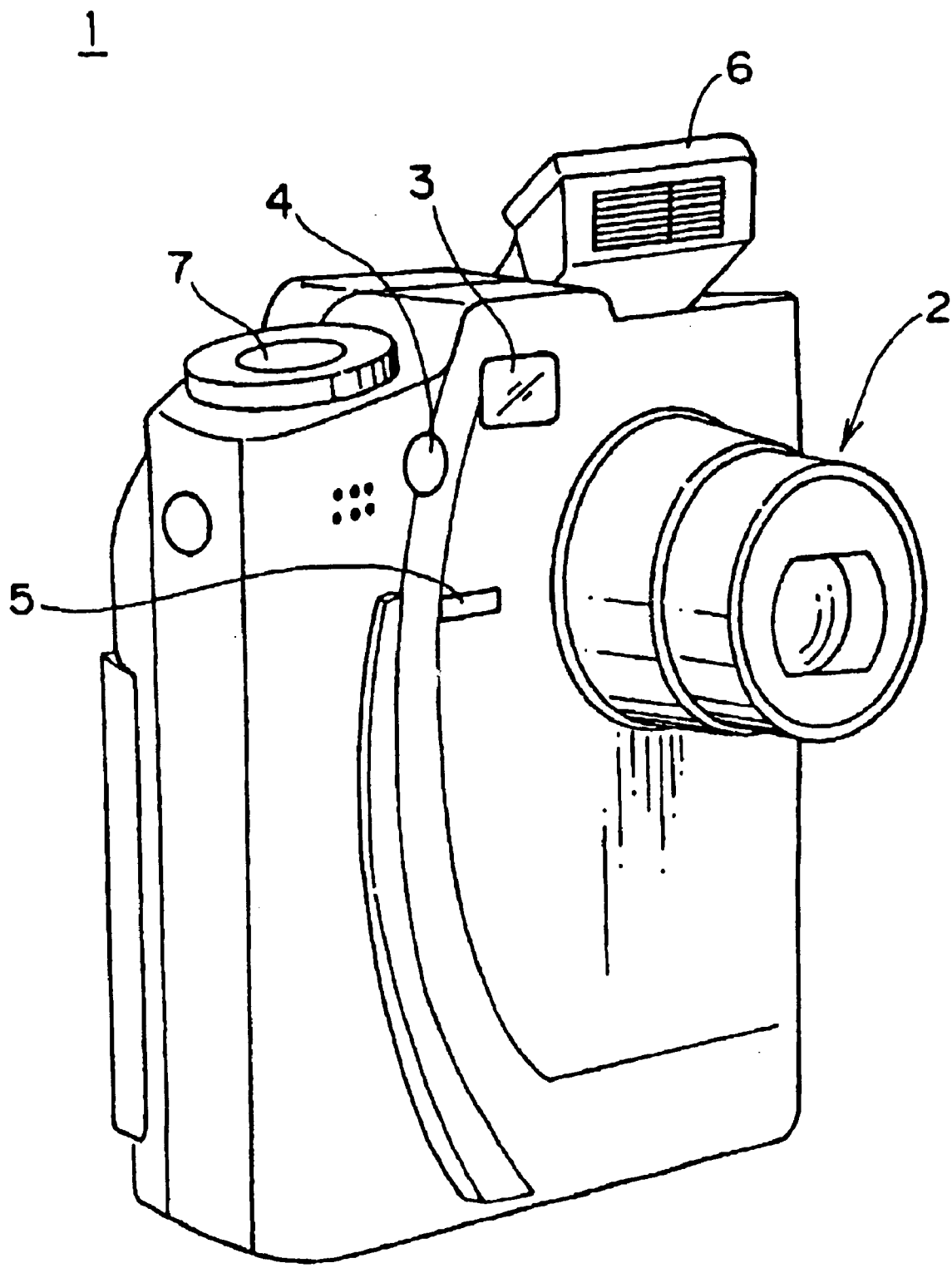
FIG. 1 is a front perspective view that shows an electronic still camera with an embodiment of the lens device of the present invention.

An embodiment of the lens device of the present invention and its method of assembly that is also part of the present invention will be described with reference to the drawings. FIG. 1 is a front perspective view that shows an electronic still camera with an embodiment of the lens device of the present invention. As shown in FIG. 1, the electronic still camera 1 has a generally rectangular shaped body that carries a lens device 2, a finder window 3, a strobe light adjusting sensor 4, and a self-timer 5 on the front, and a pop-up strobe 6 and a release switch 7 on the top. A finder ocular, a liquid crystal panel, and an operation panel, which are not shown, may conventionally be on the back of the camera. The electronic still camera 1 is of the retractable lens type, and, as shown in FIG. 1, the lens device protrudes from the front with the lens barrel extended from the camera body for use.

Figure 2:
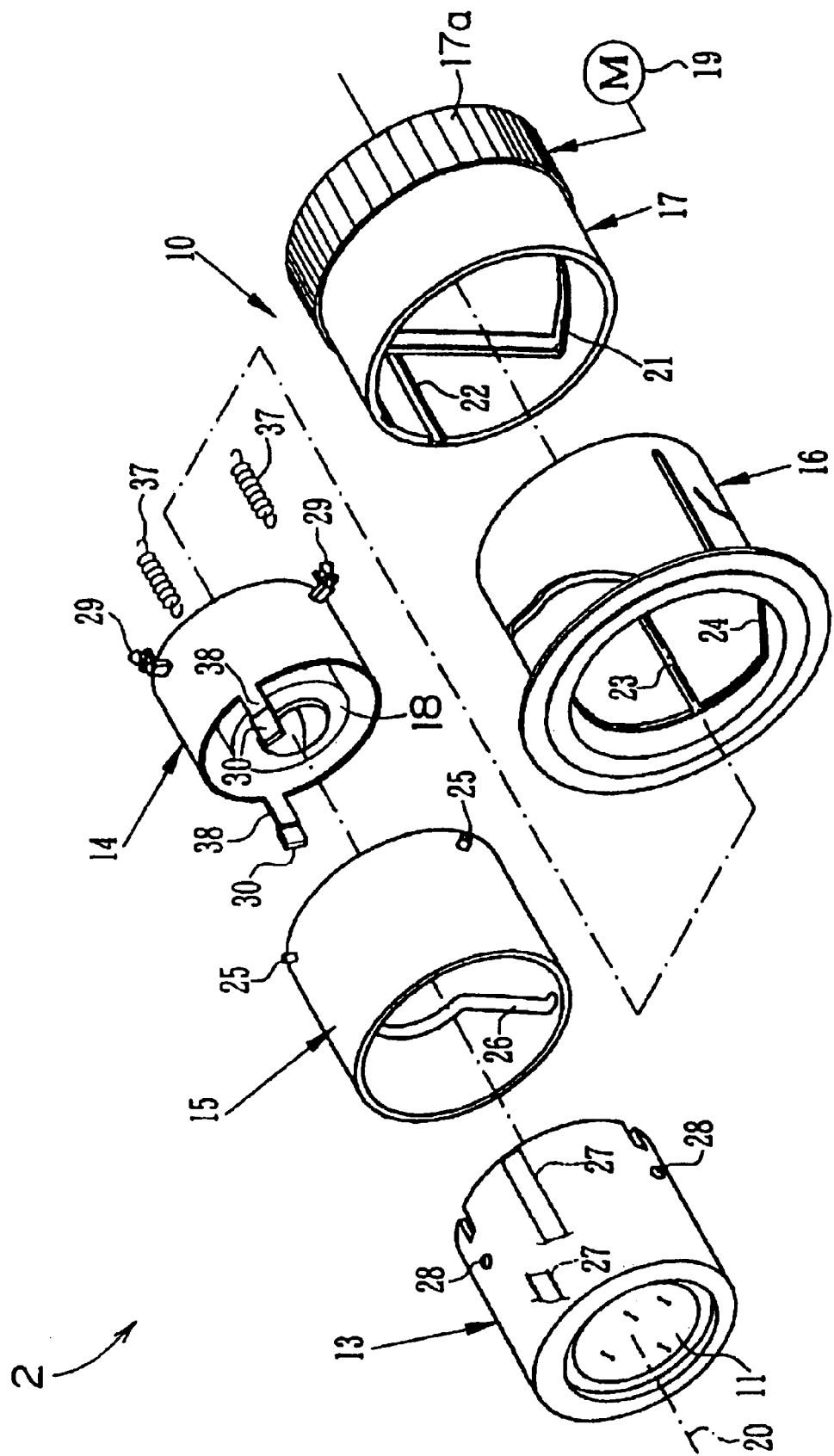
FIG. 2 is an exploded perspective view of the lens device of FIG. 1.
Figure 3:
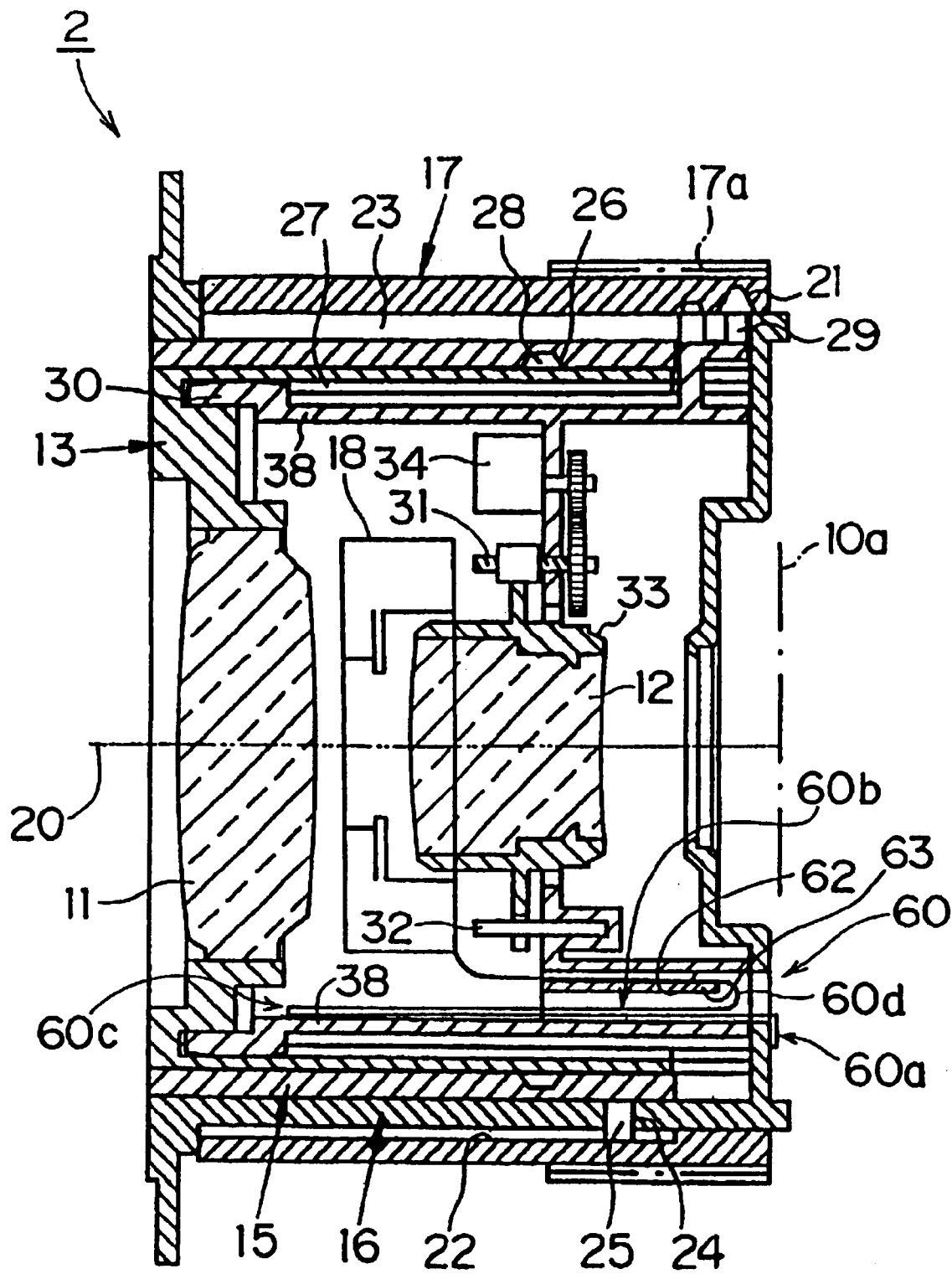
FIG. 3 shows a cross-sectional side view along the optical axis of the lens device of FIG. 1 at the retracted position.
Figure 4:
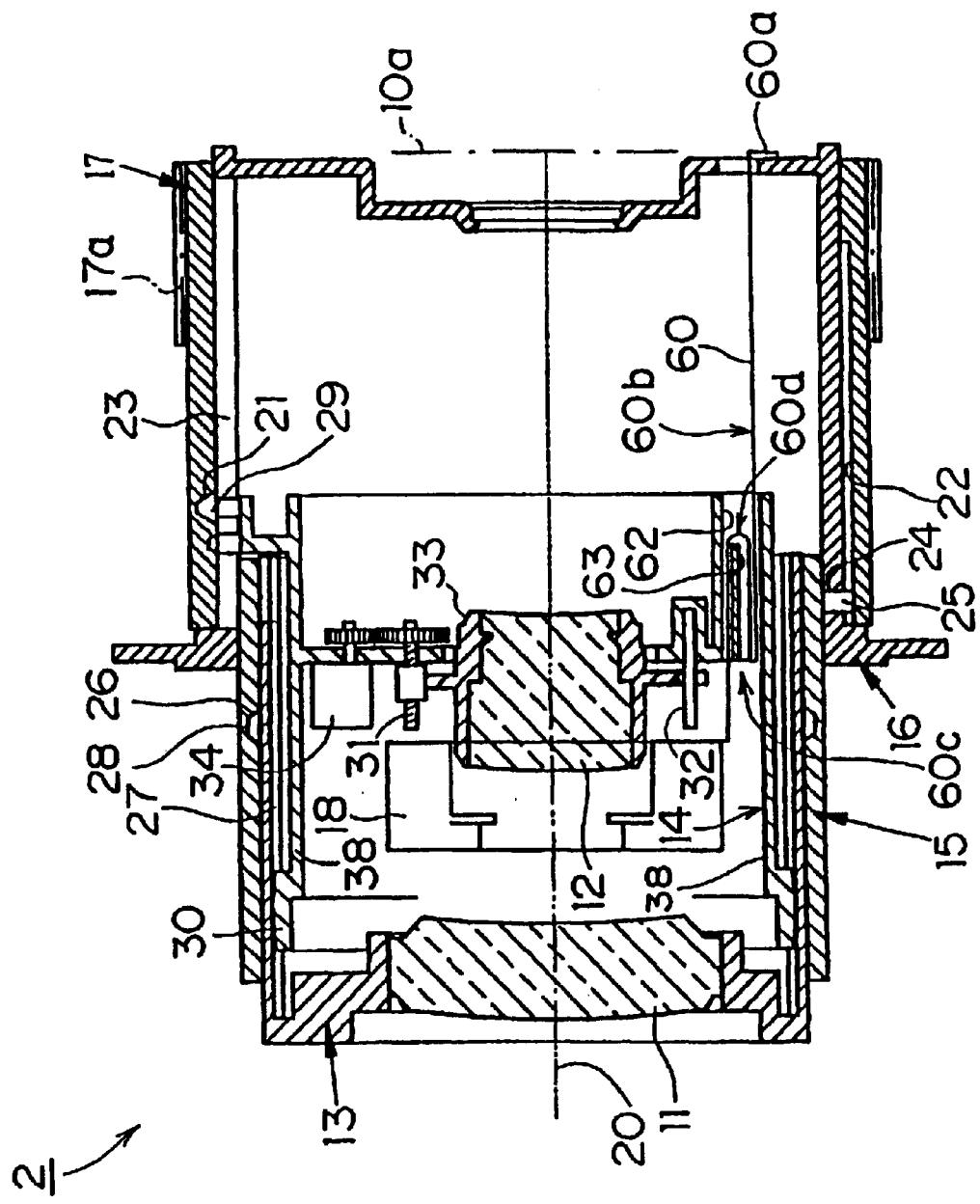
FIG. 4 shows a cross-sectional side view along the optical axis of the lens device of FIG. 1 at the telephoto position.
Figure 5:
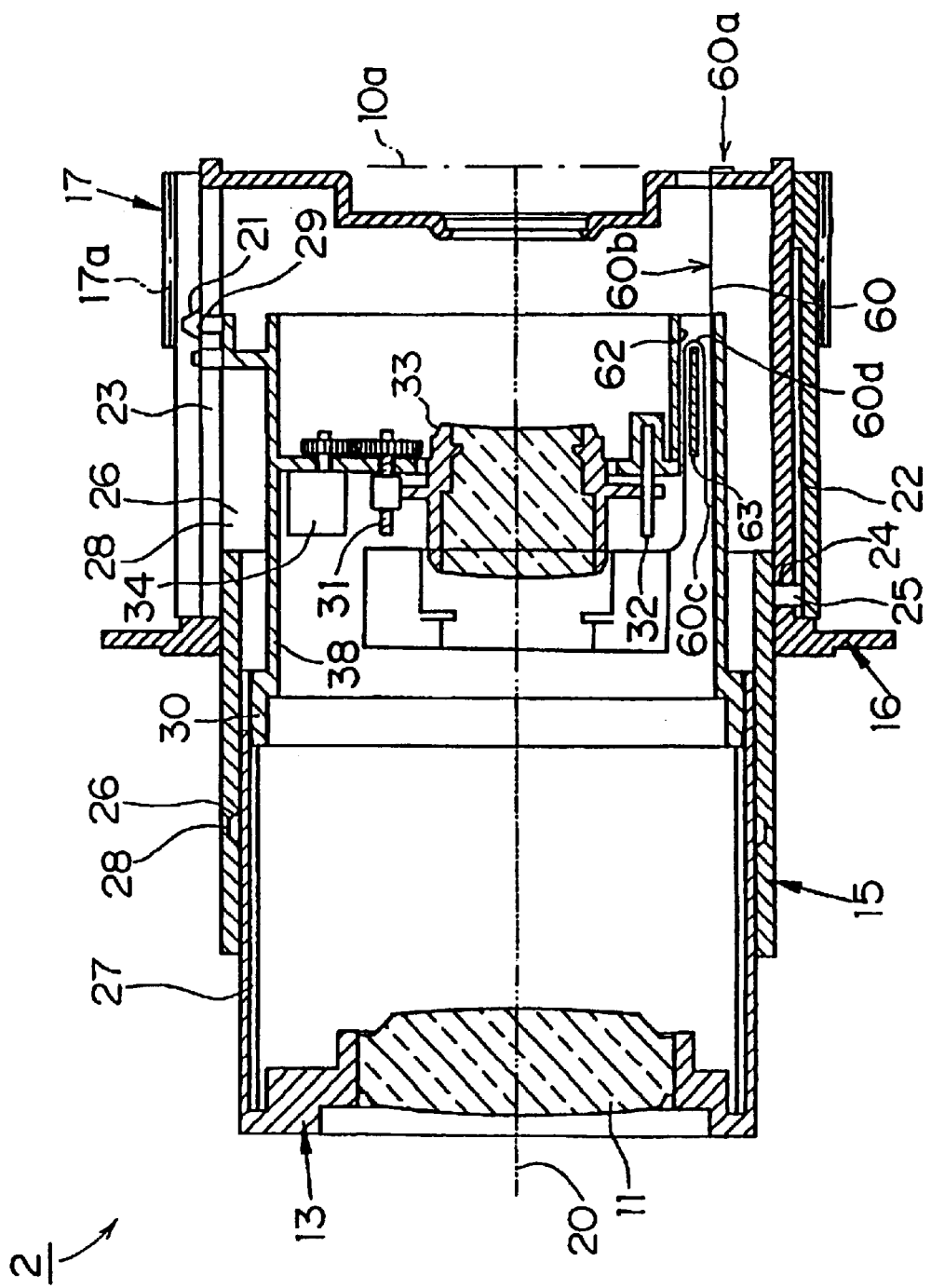
FIG. 5 shows a cross-sectional side view along the optical axis of the lens device of FIG. 1 at the wide-angle position.

FIG. 2 is an exploded perspective view of the lens device of FIG. 1. FIGS. 3 to 5 show cross-sectional side views along the optical axis of the lens device of FIG. 1. FIG. 3 shows the lens device 2 at the retracted position, and FIGS. 4 and 5 show the lens device 2 at the telephoto and wide-angle positions, respectively.

As shown in FIGS. 2 to 5, the lens device 2 includes a first lens 11, a second lens 12, a first lens barrel 13, a second lens barrel 14, a movable barrel 15, a fixed barrel 16, a rotatable barrel 17, and a diaphragm shutter unit 18. The rotatable barrel 17 is provided with a gear member 17a on the outer periphery. The gear member 17a receives the driving force from a zoom motor 19. When the gear member 17a receives a driving force from the zoom motor 19, the rotatable barrel 17 rotates in contact with the outer periphery of the fixed barrel 16. The lens device 2 changes its state from the retracted position shown in FIG. 3 to the telephoto position shown in FIG. 4 as the rotatable barrel 17 rotates in "the housing rotation range" from an "initial" to a "middle" position. The lens device 2 changes its state from the telephoto position, shown in FIG. 4, to the wide-angle position shown in FIG. 5 as the rotatable barrel 17 rotates in "the zooming rotation range" from the "middle" to a "final" position.

The rotatable barrel 17 is provided with second lens cam units 21 for moving the second lens barrel 14 along the optical axis 20 and movable barrel forwarding guide grooves 22 for guiding the movable barrel 15 along the optical axis 20 on the inner periphery. The second lens cam units 21 and movable barrel forwarding guide grooves 22 are each provided at three positions equally apart around the optical axis 20. The fixed barrel 16 is provided with second lens forwarding guide openings 23 for guiding the second lens barrel 14 straight forward along the optical axis 20 and movable barrel cams 24 for moving the movable barrel 15 along the optical axis 20 on the periphery. The second lens forwarding guide openings 23 and movable barrel cams 24 are each provided at three positions equally apart around the optical axis 20.

The movable barrel 15 is provided with movable barrel cam followers 25 on the outer periphery. The movable barrel cam followers 25 are provided at three positions equally apart around the optical axis 20 and are engaged with the movable barrel cams 24 formed on the fixed barrel 16 and with the movable barrel forwarding guide grooves 22 formed on the rotatable barrel 17. When the rotatable barrel 17 rotates, the movable barrel cams 24 and movable barrel forwarding guide grooves 22 cooperate to move the movable barrel 15 along the optical axis 20 while rotating in relation to the fixed barrel 16.

The movable barrel 15 is further provided with first lens cams 26 on the inner periphery for moving the first lens barrel 13 along the optical axis 20. The first lens cams 26 are provided at three positions equally apart around the optical axis 20. The first lens barrel 13 is provided with forwarding guide grooves 27 on the inner periphery. The forwarding guide grooves 27 are engaged with forwarding guide projections 30 formed on the second lens barrel 14.

The first lens barrel 13 is provided with first lens cam followers 28 on the outer periphery. The first lens cam followers 28 are provided at three positions equally apart around the optical axis 20 and are engaged with the first lens cams 26 formed on the inner periphery of the movable barrel 15. When the movable barrel 15 rotates, the first lens cams 26 and the second lens barrel 14, which serves as the forwarding guide, as is described later, cooperate to forward the first lens barrel 13 along the optical axis 20 relative to the movable barrel 15. The first lens 11 is held at the forward end of the inner periphery of the first lens barrel 13 and moves with the first lens barrel 13.

The second lens barrel 14 is provided with second lens cam follower units 29 on the outer periphery. The second lens cam follower units 29 are provided at three positions equally apart around the optical axis 20 and are engaged with the second lens cam units 21 and with the second lens forwarding guide openings 23. When the rotatable barrel 17 rotates, the second lens cam units 21 and the second lens forwarding guide openings 23 cooperate to forward the second lens barrel 14 along the optical axis 20 in relation to the fixed barrel 16.

The second lens barrel 14 is provided with a pair of springs 37 between the fixed barrel 16 and itself. The springs 37 are provided at positions around the optical axis 20 and bias the second lens barrel 14 toward the image plane. The second lens barrel 14 is integrally provided with arms 38 at the front end. The arms 38 are provided on the outer periphery at two separate positions a fixed distance apart around the optical axis 20. The arms 38 are small in width and extend from the front end of the second lens barrel 14 toward the object.

Forwarding guide projections 30 are integrally formed on the outer periphery at the tip of the arms 38. The forwarding guide projections 30 are engaged with the forwarding guide grooves 27 formed on the inner periphery of the first lens barrel 13, and their side walls 30a and 30b (see FIG. 6) abut against the inner walls 27a and 27b of the forwarding guide grooves 27. The forwarding guide projections 30 and forwarding guide grooves 27 cooperate to forward the first lens barrel 13 along the optical axis 20 in relation to the second lens barrel 14.

The second lens barrel 14 is molded of resilient material such as plastic. The arms 38 extend with their tips directed diametrically outward. Therefore, when the forwarding guide projections 30 are engaged with the forwarding guide grooves 27, the bottoms 27c of the forwarding guide grooves 27 are pressed diametrically outward by the outer peripheries 30c of the forwarding guide projections 30. As a result, the first lens barrel 13 is held without tilting in relation to the second lens barrel 14.

As is described above, the forwarding guide projections 30 slide in the forwarding guide grooves 27 while pressing the bottoms 27 thereof diametrically outward. Sliding with this surface contact imposes load on the movement of the first lens barrel 13 in relation to the second lens barrel 14 and on the rotation of the rotatable barrel 17 and may reduce the zoom speed. In order to reduce the drag of sliding, each forwarding guide projection 30 has a semispherical outer periphery 30c. The forwarding guide projections 30 have an arc cross-section both along and across the optical axis 20. This allows smooth movement of the first lens barrel 13 in relation to the second lens barrel 14 and smooth rotation of the rotatable barrel 17.

The second lens 12 is movable in the second lens barrel 14 along the optical axis 20. As shown in FIGS. 3 to 5, the second lens 12 is held by a second lens frame 33 provided in the second lens barrel 14. Being held by a feed screw 31 and a guide bar 32, the second lens frame 33 is movable in the second lens barrel 14 along the optical axis 20. The feed screw 31 is connected to the output shaft of a focusing motor 34 that operates to rotate the feed screw 31. Rotation of the feed screw 31 causes the second lens 12 to move along the optical axis 20.

The second lens 12 moves between "the original position" where it is nearest the image plane 10a and positions where it is away from "the original position" toward the object side in relation to the second lens barrel 14. For zooming, the second lens 12 returns to "the original position".

The diaphragm shutter unit 18, is fixed to the second lens frame 33. The diaphragm shutter unit 18 includes a diaphragm and a shutter, not shown in the drawings, which are driven by a diaphragm motor and a shutter motor, which are also not shown in the drawings. The diaphragm shutter unit 18 is programmable and operates based on operation signals supplied by a control part in the camera body. The operation signals are transferred from the camera body to the diaphragm shutter unit 18 through the flexible printed circuit board 60 provided in the second lens barrel 14.

FIGS. 3–5 show cross-sectional side views along the optical axis of the lens device of FIG. 1 at the retracted position, at the telephoto position, and at the wide-angle position, respectively. As shown in FIGS. 3–5, the flexible printed circuit board 60 is provided in parallel to the optical axis 20 along the inner periphery of the second lens barrel 14. One end of the flexible printed circuit board 60 is connected to the diaphragm shutter unit 18 and the other end is fixed to a circuit board provided in the camera body. This electrically connects the diaphragm shutter unit 18 to the control part in the camera body. The flexible printed circuit board 60 includes a loop so that it tolerates shifts due to zooming and retraction of the lens barrels. In order to prevent problems associated with the shifts, the flexible printed circuit board 60 is housed in the through-channel 62.

Figures 6A, 6B:
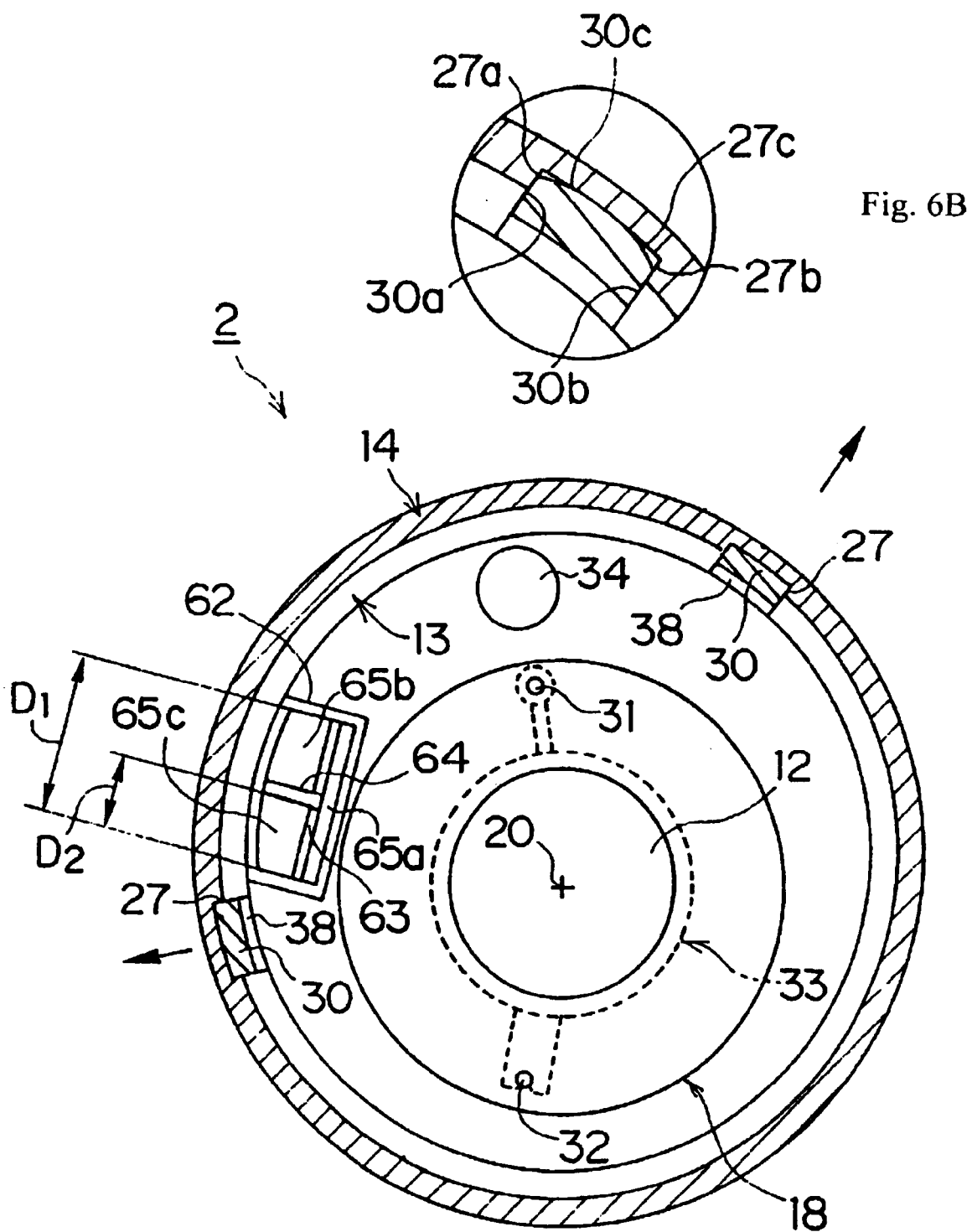
FIG. 6A shows a cross-sectional view perpendicular to the optical axis of the lens device of FIG. 1.
FIG. 6B shows an enlarged view of a portion of FIG. 6A.
Figures 13A, 13B:
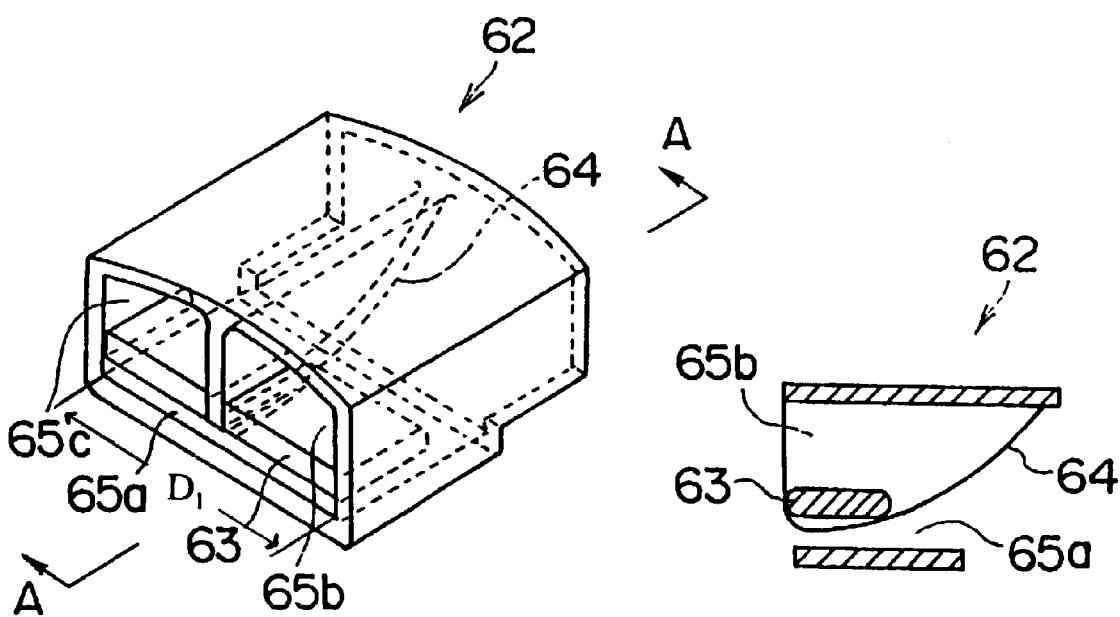
FIG. 13A shows a perspective view of the through-channel of the lens device of FIG. 1.
FIG. 13B shows an enlarged cross-sectional view along the line A—A of FIG. 13A.
Figure 14A:
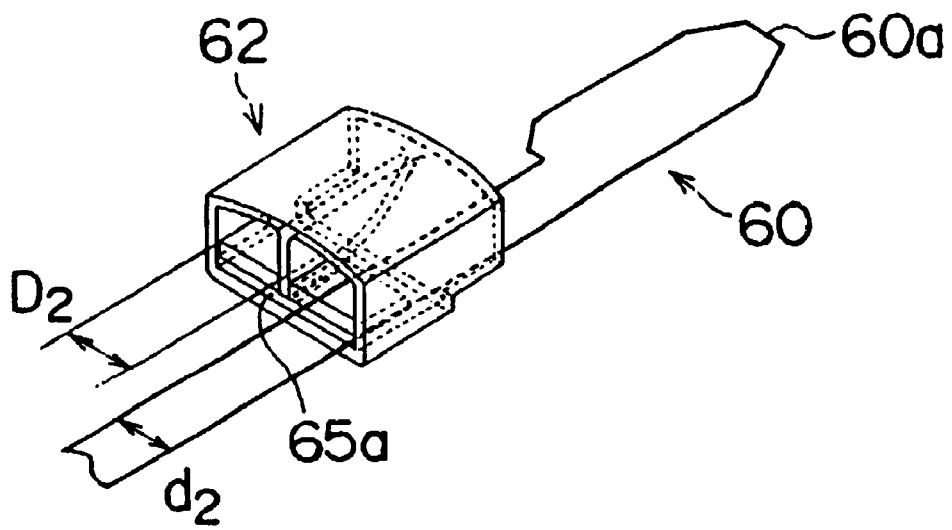
FIGS. 14A and 14B show perspective views of the through-channel of the lens device of FIG. 1 with a flexible printed circuit board inserted in a through-channel.
Figure 14B:
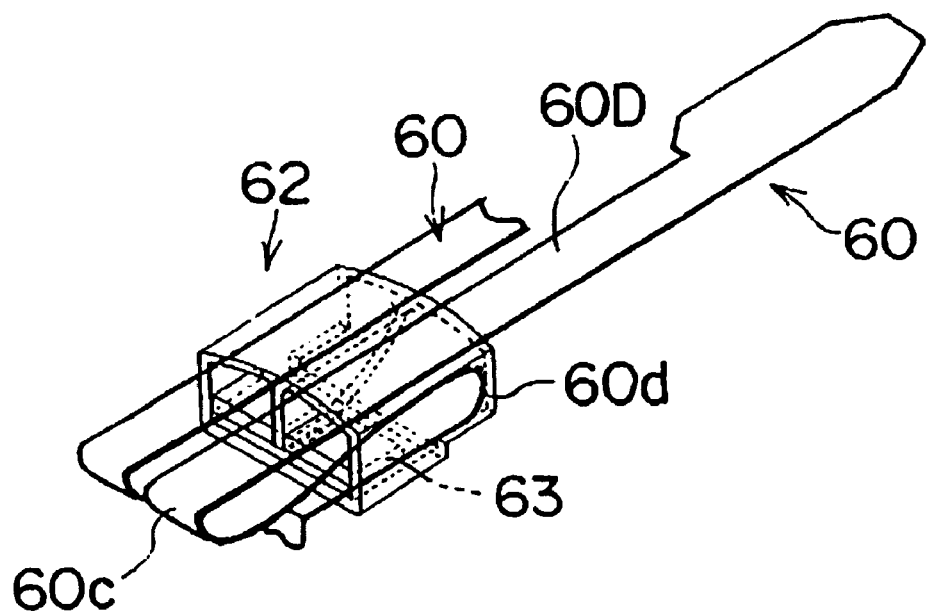

As shown in FIGS. 3–5, the through-channel 62 is integrally formed on the inner periphery of the second lens barrel 14 along the optical axis 20. It has, as shown in FIGS. 6A, 13A, 13B, 14A, and 14B, a part with a nearly rectangular outer periphery that forms part of the inner periphery of the second lens barrel 14. FIG. 6A shows a cross-sectional view perpendicular to the optical axis of the lens device of FIG. 1. FIG. 6B shows an enlarged view of a portion of FIG. 6A. FIG. 13A shows a perspective view of the through-channel 62 and FIG. 13B shows an enlarged cross-sectional view along the line A—A of FIG. 13A. FIGS. 14A and 14B show perspective views of the through-channel 62 with the flexible printed circuit board 60.

The through-channel 62 includes upper and lower tiers. The lower tier includes a lower through-channel 65a extending over the full width of the inner periphery. The upper tier is divided by a vertical partition 64 precisely at or approximately at the center into right and left through-channels 65b and 65c, respectively. The upper and lower tiers are separated by a horizontal partition 63 that does not extend over the entire length of the through-channel along the optical axis 20. The horizontal partition 63 is supported at its center by the vertical partition 64. The terms "upper" and "lower" for the tiers indicate that one is on top of the other. However, that is only for convenience of explaining the structure of the through-channel 62. In actual use, the tiers may be used in the upside-down or side by side position.

In FIG. 13B, one end, the left end as shown in FIG. 13B, of the horizontal partition 63 is nearly aligned with the left end as shown in FIG. 13B of the through-channel 62 in the lengthwise direction thereof. The other end, the right end as shown in FIG. 13B, of the horizontal partition 63 is inside the through-channel 62. The bottom part of the vertical partition 64 is gently curved with no steps so as to connect the right end, as shown in FIG. 13B, of the horizontal partition 63 to the right end, as shown in FIG. 13B, of the through-channel 62. The use of the through-channel 62 during assembly and operation of the lens device 2 will be discussed later with a discussion of the assembly process of the lens device 2.

Figure 12:
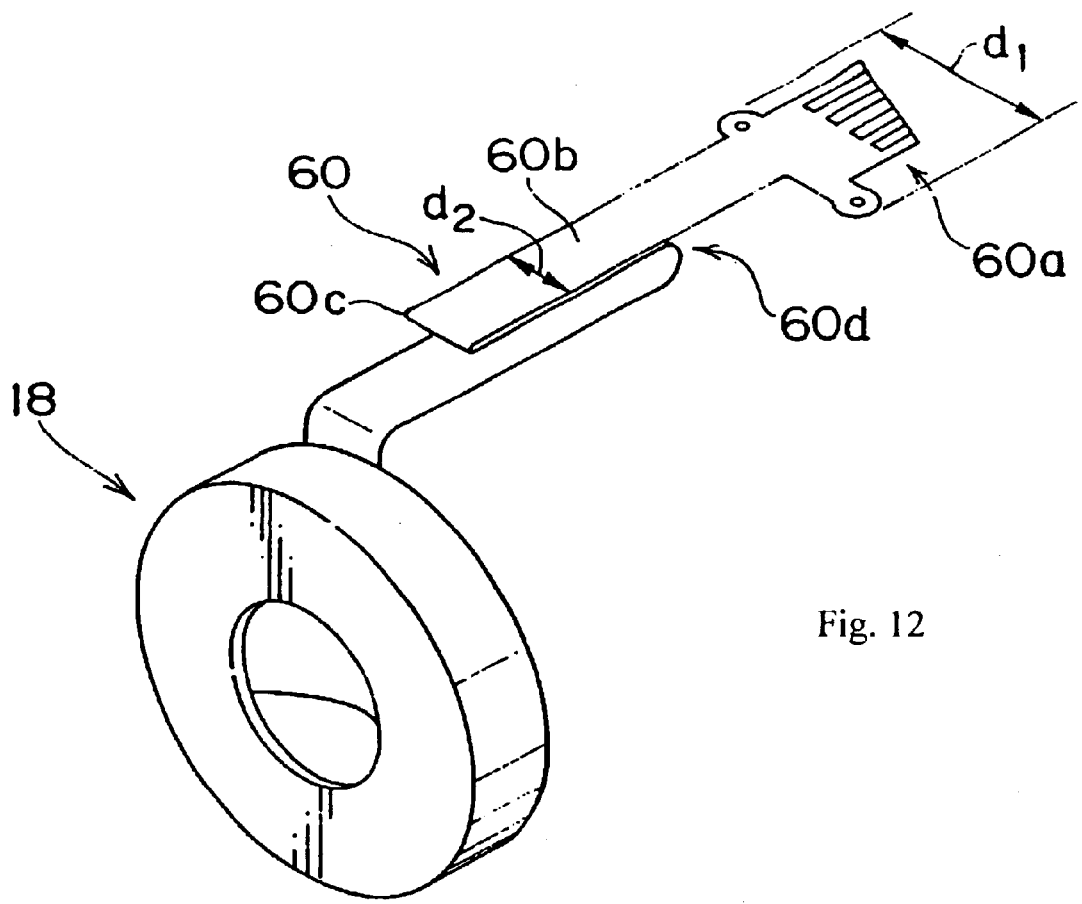
FIG. 12 shows a perspective view of a flexible printed circuit board and a diaphragm shutter unit for use in the lens device of FIG. 1.

FIG. 12 shows a perspective view of the flexible printed circuit board 60 and the diaphragm shutter unit 18. As shown in FIG. 12, the flexible printed circuit board 60 has already been connected to the diaphragm shutter unit 18 at one end so that they are united into one piece when the assembly of the lens device 2 begins. In the assembly of the lens device 2, the diaphragm shutter unit 18 is mounted on the second lens frame 33 and the other end of the flexible printed circuit board is inserted in the through-channel 62.

As shown in FIG. 12, the flexible printed circuit board 60 has a band shape but does not have a uniform width. The flexible printed circuit board 60 includes connection parts 60a at both ends (only one end is shown) that abut against and are fixed to the fixed barrel 16, as shown in FIG. 3, for connection to a circuit board provided in the camera body (not shown). The connection parts 60a are larger in width than is the center part 60b of the flexible printed circuit board 60 that extends for connection to devices such as the diaphragm shutter unit 18. As shown in FIGS. 6A and 12, the through-channel 62 at the lower through-channel 65a has a width $D_1$ that is nearly equal to, or slightly larger than, the width $d_1$ of the connection part 60a of the flexible printed circuit board 60 so that the connection part 60a can be inserted therein.

There would be a problem with crosswise play of the center parts 60b of the flexible printed circuit board 60 if the center parts passed through a portion of through-channel 62, such as through channel 65a, with a width $D_1$ that is about equal to the width $d_1$ of the connection part 60a of the flexible printed circuit board 60. To avoid the problem of crosswise play, the upper tier of the through-channel 62 is divided into right and left through-channels 65b and 65c along the optical axis 20 by the vertical partition 64. The vertical partition 64 serves to reduce the width of the upper tier of the through-channel 62. In this way, the center part 60b of the flexible print board 60 inserted in the through-channel 62 does not have crosswise play and, therefore, shifts in a secure manner. In order to eliminate crosswise play at the center part 60b, the vertical partition 64 is positioned to give a width $D_2$ between the partition 64 and the inner surface of the through-channel 62 that is nearly the same as the width $d_2$ of the center part 60b of the flexible print board 60.

Figure 15A:
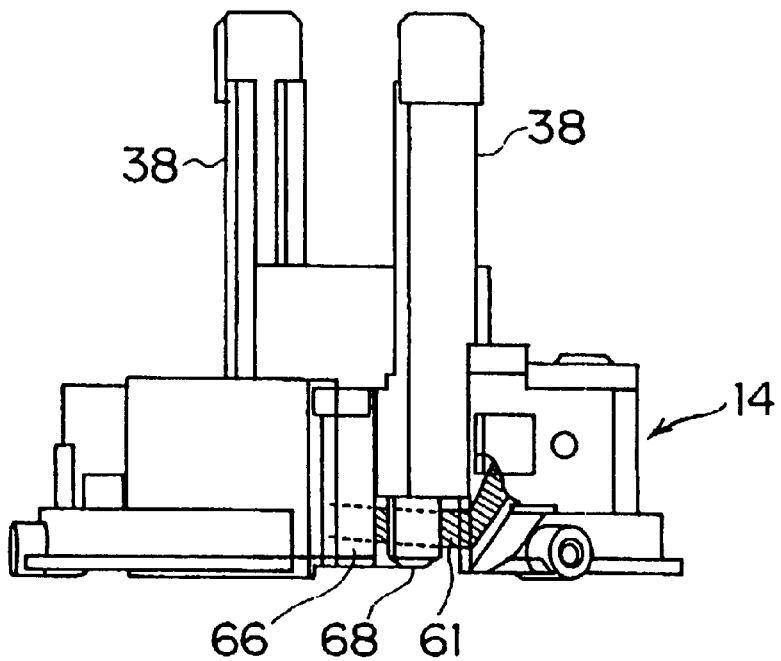
FIG. 15A shows a plan view of the second lens barrel of the lens device of FIG. 1.
Figure 15B:
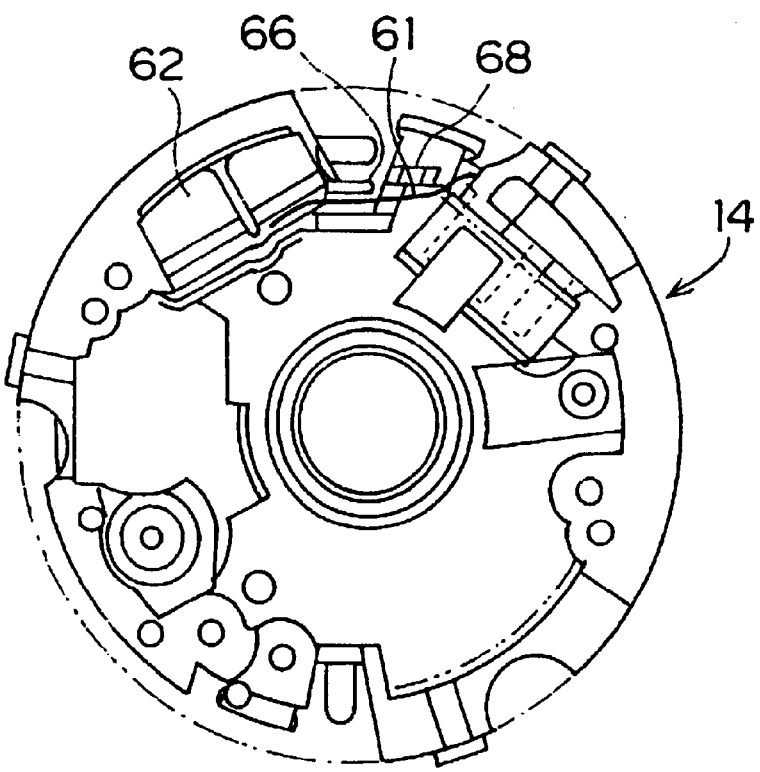
FIG. 15B shows a front view of the second lens barrel of the lens device of FIG. 1.
Figure 16:
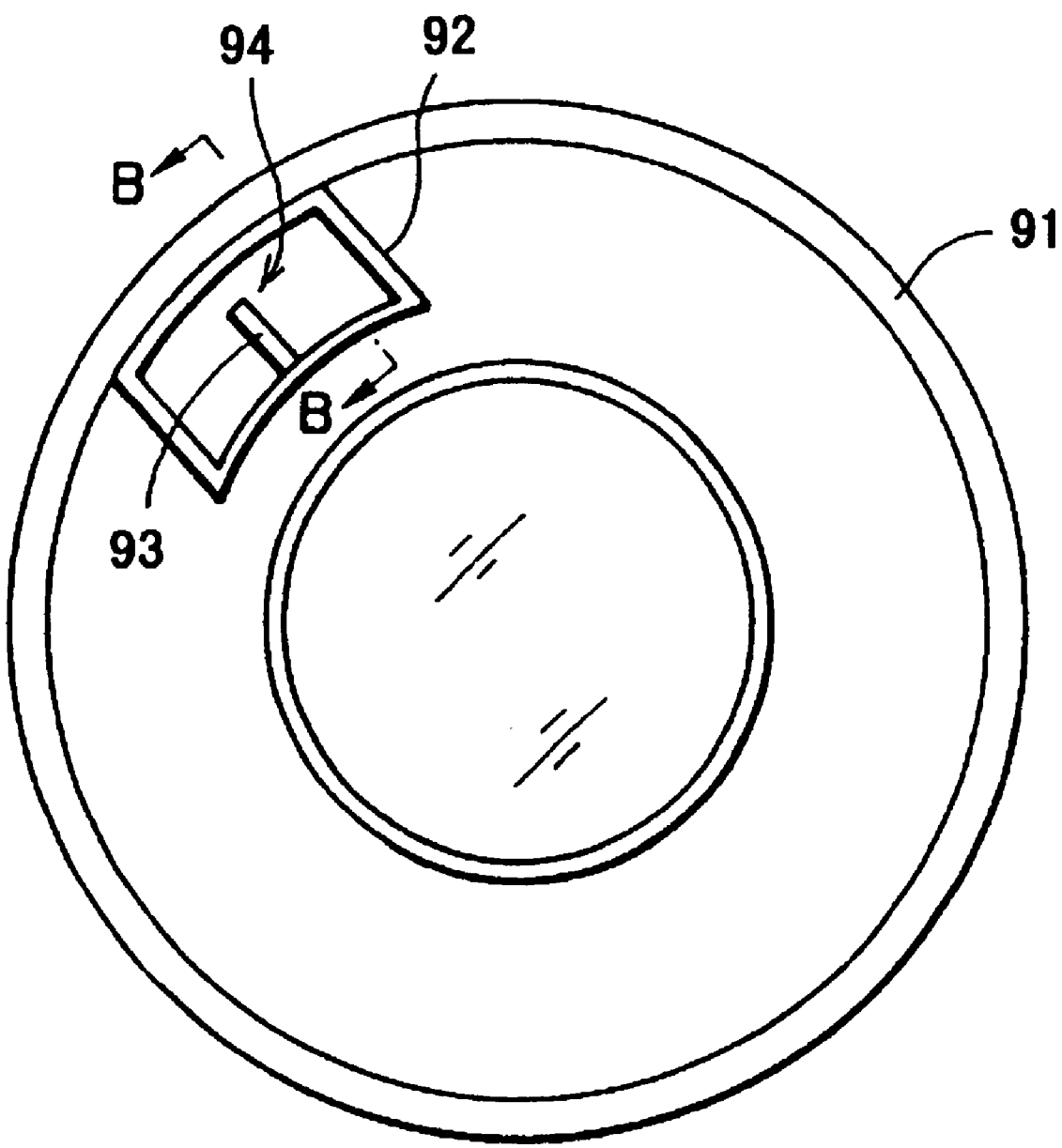
FIG. 16 shows a cross-sectional view perpendicular to the optical axis of a prior art lens device.

FIG. 15A shows a plan view of the second lens barrel 14, and FIG. 15B shows a front view of the second lens barrel 14. As shown in FIGS. 15A and 15B, a flexible printed circuit board 61 extends in the circumferential direction around the optical axis 20. In order to prevent problems with the flexible printed circuit board 61, a first guide projection 66 and a second guide projection 68, which are flat overhanging members, are oriented parallel to the optical axis 20 and on the outer peripheral sides of the flexible printed circuit board 61.

Figure 7:
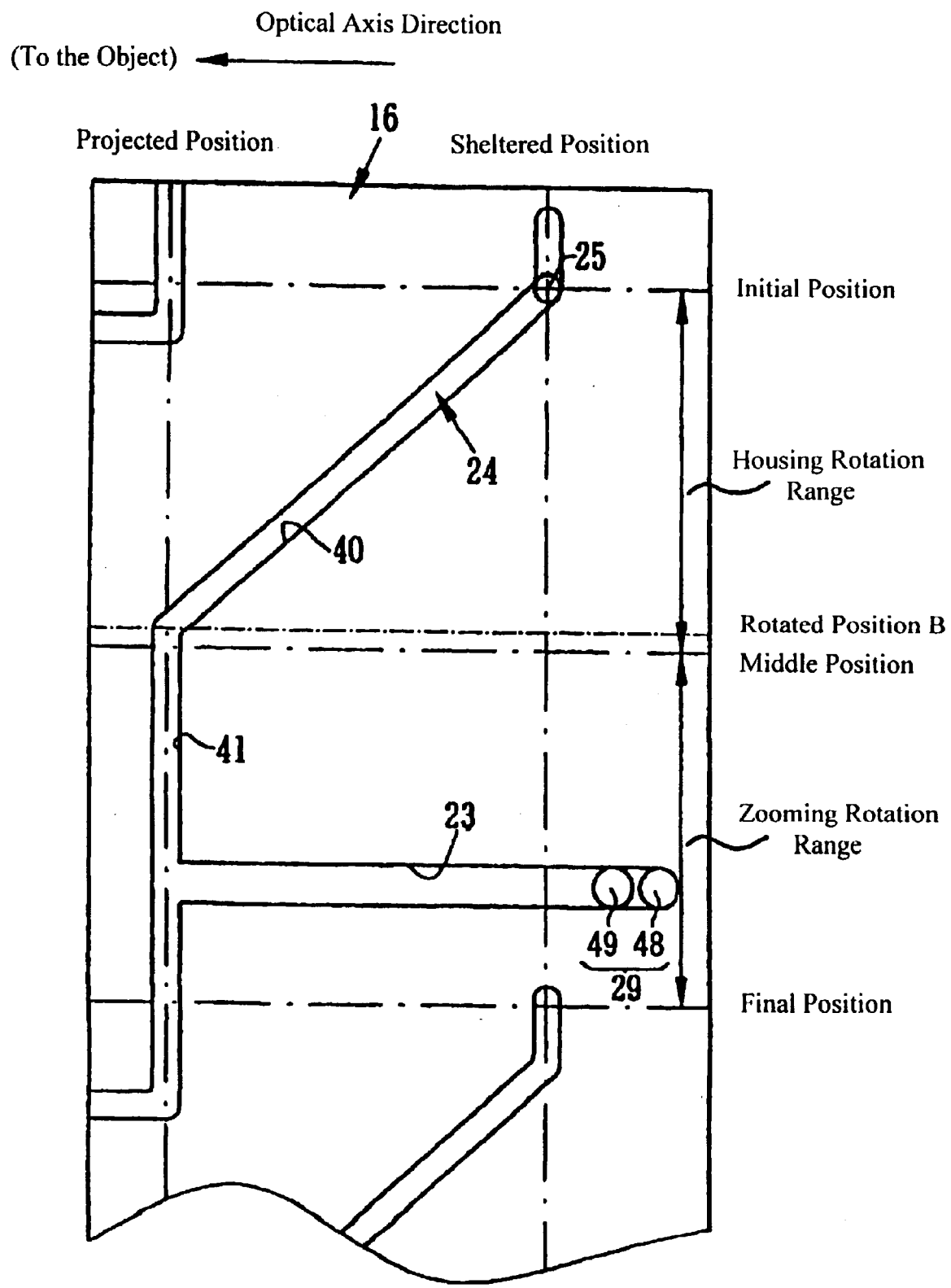
FIG. 7 is a diagram that shows the structure of the movable barrel cam provided on the fixed barrel of the lens device of FIG. 1.

FIG. 7 is a diagram that shows the structure of the movable barrel cams 24 provided on the fixed barrel 16. The movable barrel cam 24s include a housing guide section 40 and a movable barrel movement inhibiting section 41. The housing guide section 40 defines a range over which the movable barrel cam followers 25 slide in accordance with the rotation of the rotatable barrel 17 in "the housing rotation range." The housing guide section 40 moves the movable barrel 15 relative to the fixed barrel 16 between "the sheltered position" where it is sheltered inside, and "the projected position" where it is projected toward the object along the optical axis 20. When the movable barrel 15 is at the sheltered position, the lens device 2 is in the retracted state.

The movable barrel movement inhibiting section 41 defines a range over which the movable barrel cam followers 25 slide in accordance with the rotation of the rotatable barrel 17 in "the zooming rotation range." The movable barrel movement inhibiting section 41 forms an arc around the optical axis 20 that allows rotation of the movable barrel 15 around the optical axis 20 and prevents the movable barrel 15 from moving along the optical axis 20. In this way, the movable barrel 15 remains at "the projected position" during the zooming of the lens device 2 between the telephoto and wide-angle positions.

Figure 8:
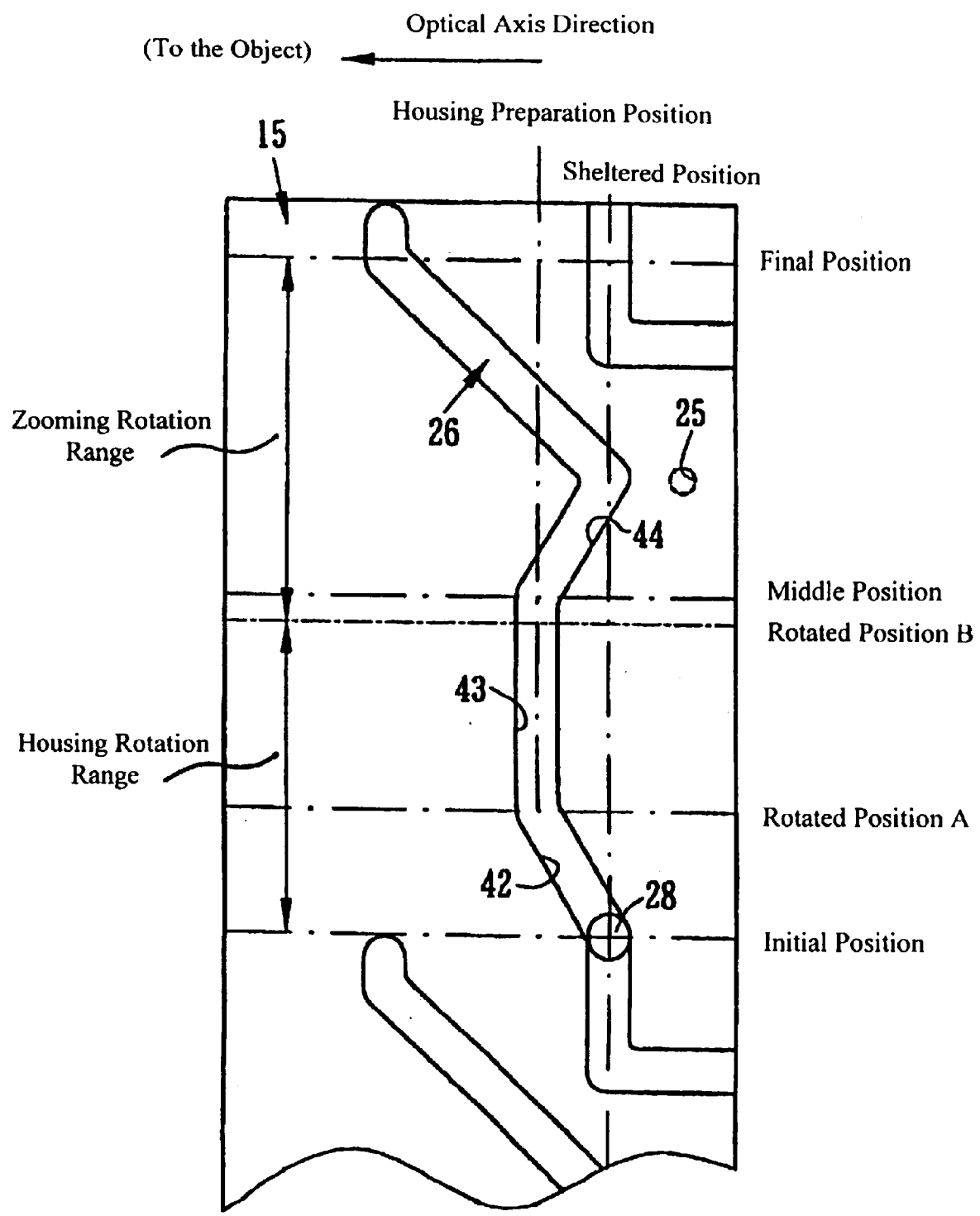
FIG. 8 is a diagram that shows the structure of the first lens cam provided on the movable barrel of the lens device of FIG. 1.

FIG. 8 is a diagram that shows the structure of a first lens cam 26 provided on the movable barrel 15. As shown in FIG. 8, the first lens cam 26 includes a housing preparation guide section 42, a first lens movement inhibiting section 43, and a zooming guide section 44. The housing preparation guide section 42 defines a range over which the first lens cam follower 28 slides within the rotation range of the movable barrel 15 corresponding to the rotation range of the rotatable barrel 17 up to "the rotated position A" that is between the "initial" and "middle" positions. The housing preparation guide section 42 moves the first lens barrel 13 relative to the movable barrel 15 between "the sheltered position" where the first lens barrel 13 is sheltered inside the moveable barrel 15 and "the housing preparation position" where it is slightly projected toward the object. When the first lens barrel 13 is at "the sheltered position," the lens device is in the retracted state.

The first lens movement inhibiting section 43 defines a range over which the first lens cam follower 28 slides within the rotation range of the movable barrel 15 corresponding to "the housing rotation range" of the rotatable barrel 17. The first lens movement inhibiting section 43 forms an arc around the optical axis 20 so that it prevents the first lens barrel 13 from moving from "the housing preparation position" along the optical axis 20 while allowing the rotation of the movable barrel 15. In this way, the first lens barrel 13 remains at "the housing preparation position" while the lens device 2 shifts from the retracted position to the telephoto position. The first lens movement inhibiting section 43 maintains the first lens barrel 13 at "the housing preparation position" while the rotatable barrel 17 rotates from "the rotated position A" to the "middle" position.

The zooming guide section 44 defines a range over which the first lens cam follower 28 slides within the rotation range of the movable barrel 15 corresponding to "the zooming rotation range" of the rotatable barrel 17. The zooming guide section 44 has a profile that moves the first lens barrel 13 along the optical axis 20 for changing the focal length. The housing preparation guide section 42 is not necessary. It may be omitted and the first lens movement inhibiting section 43 may cover the full rotation range of the movable barrel 15 corresponding to "the housing rotation range" of the rotatable barrel 17.

Figure 9:
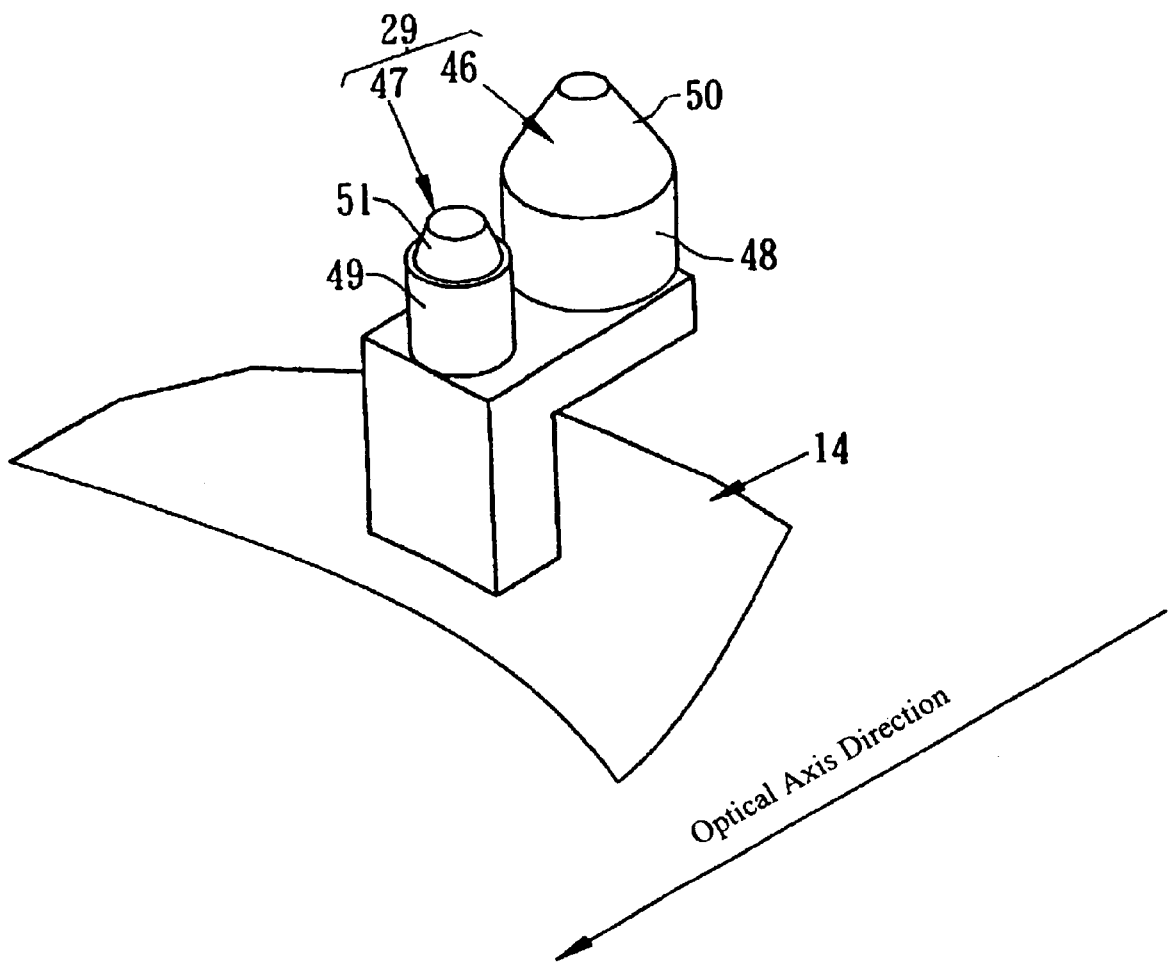
FIG. 9 shows a perspective view of the essential structure of the second lens cam follower unit of the lens device of FIG. 1.

FIG. 9 shows a perspective view of the essential structure of the second lens cam follower unit 29. As shown in FIG. 9, the second lens cam follower unit 29 includes a main cam follower 46 and a subsidiary cam follower 47 provided at different distances along the optical axis 20.

The main cam follower 46 and the subsidiary cam follower 47 include first engaging parts 48, 49 and second engaging parts 50, 51, respectively. The first engaging parts 48 and 49 have the same diameter and are engaged with the second lens forwarding guide opening 23 (see FIG. 7). The second engaging parts 50 and 51 are each truncated cones. The second engaging part 50 of the main cam follower 46 has a larger diameter than the second engaging part 51 of the subsidiary cam follower 47 that is on the object side. Both of the first engaging parts 48 and 49 are engaged with the second lens forwarding guide opening 23. Therefore, one of the first engaging parts 48 and 49 could be smaller in diameter than the other, as shown in FIG. 9.

Figure 10:
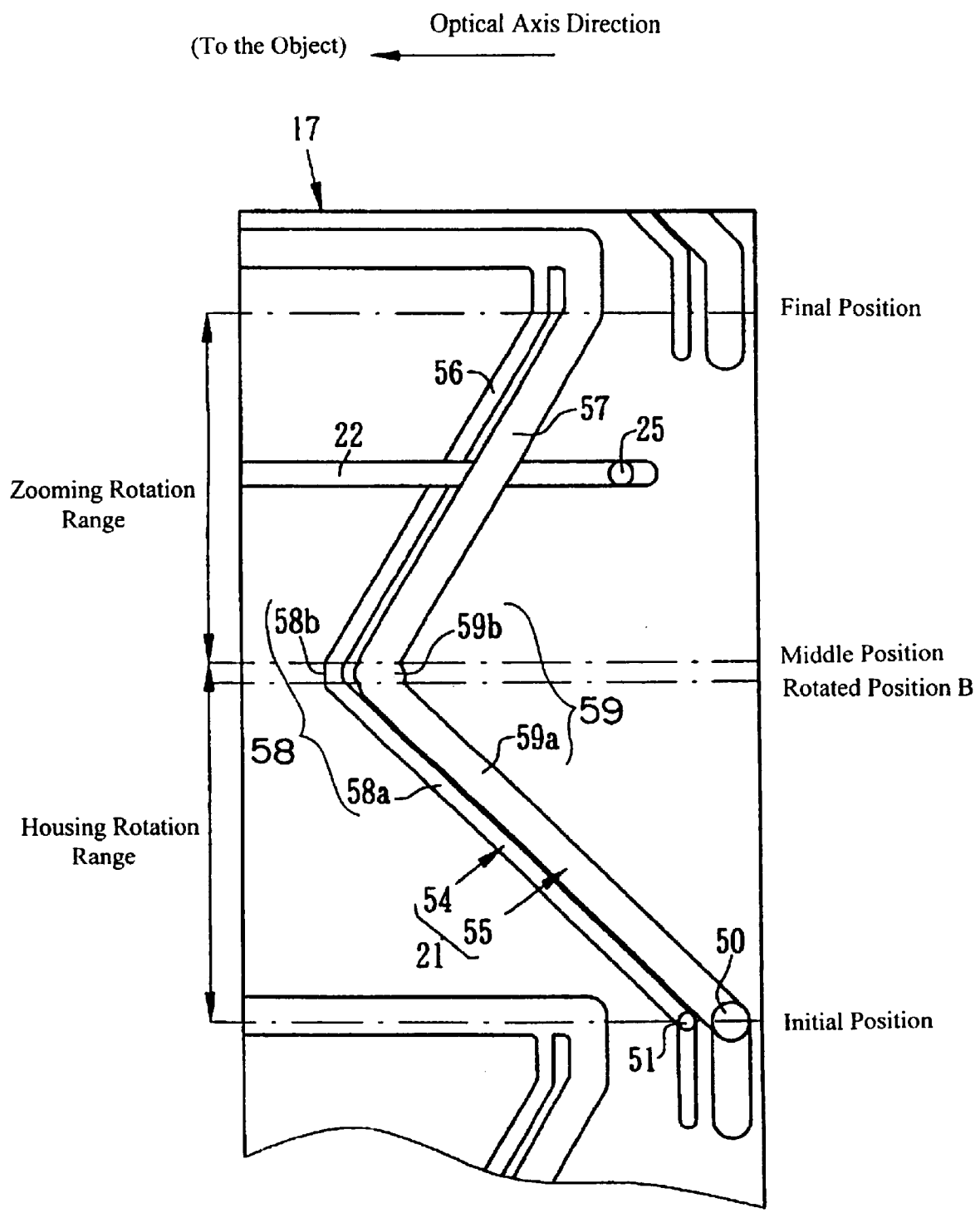
FIG. 10 is a diagram that shows the essential structure of the second lens cam unit of the lens device of FIG. 1.

FIG. 10 is a diagram that shows the essential structure of the second lens cam unit 21. As shown FIG. 10, the second lens cam unit 21 includes a subsidiary cam groove 54 and a main cam groove 55. The second engaging part 51 of the subsidiary cam follower 47 is fitted in the subsidiary cam groove 54, and the second engaging part 50 of the main cam follower 46 is fitted in the main cam groove 55. The subsidiary cam groove 54 and the main cam groove 55 include zooming guide sections 56, 57, respectively, for moving the second lens 12 along the optical axis 20 for changing the focal length, and include housing guide sections 58, 59, respectively, for moving the second lens to "the housing position" from the zooming guide section. Each of the zooming guide sections 56, 57 has a curved track to move the second lens barrel 14 in "the reel-in direction" in which the second lens barrel 14 is retracted toward the image plane while the rotatable barrel 17 rotates toward "the final position" within "the zooming rotation range."

The housing guide sections 58, 59 have straight sections 58a, 59a and bent sections 58b, 59b, respectively. The straight sections 58a, 59a form straight tracks to guide the second lens barrel 14 in "the reel-out direction" in which the second lens barrel 14 is extended toward the object while the rotatable barrel 17 rotates toward "the middle position" within the range between "the initial position" and "the rotated position B." On the other hand, the bent sections 58b, 59b form bent tracks to turn the second lens barrel 14 to "the reel-in direction" in which the second lens barrel 14 is retracted toward the image plane while the rotatable barrel 17 rotates toward "the middle position" within the range between "the rotated position B" and "the middle position."

The main cam follower 46 and the subsidiary cam follower 47 follow the tracks at the bent sections 59b, 58b that are curved with the convex peak facing toward the object side. The subsidiary cam follower 47 has a smaller diameter than the main cam follower 46. Therefore, the closest moving track to the image plane of the main cam follower 46 has a smaller radius of curvature than the closest moving track to the image plane of the subsidiary cam follower 47.

The subsidiary cam groove 54 has the same width as the second engaging part 51 of the subsidiary cam follower 47 within the bent section 58b but is wider outside of the bent section 58b. Thus, the subsidiary cam groove 54 is engaged with the second engaging part 51 of the subsidiary cam follower 47 within the bent section 58b, but it is not engaged with it outside of the bent section 58b.

The main cam groove 55 has a width that allows the engagement of the main cam follower 46 with the second engaging part 50 outside the bent section 59b. The main cam groove 55 is wider than the second engaging part 50 of the main cam follower 46 within the bent section 59b. Thus, the second engaging part 50 of the main cam follower 46 is engaged with the main cam groove 55 outside the bent section 59b. The subsidiary cam groove 54 having a larger radius of curvature at the bent sections 58b, 59b facilitates the turning movement of the second lens barrel 14.

The second engaging parts 51 and 50 can be simultaneously engaged around the boundary between the bent sections 58b, 59b and the zooming guide sections 56, 57 or the housing guide sections 58a, 59a.

The operation of the lens device 2 having the structure described above is described below. When the lens device 2 is in its retracted state, as shown in FIG. 3, the movable barrel 15 and first lens barrel 13 are housed in the fixed barrel 16. The zooming motor 19 (FIG. 2) is driven to rotate the rotatable barrel 17 up to "the final position" from "the initial position." The rotation of the rotatable barrel 17 is transmitted to the movable barrel cam follower 25 via the movable barrel forwarding guide groove 22 (see FIG. 10). Thus, the movable barrel 15 rotates in association with the rotatable barrel 17. The movable barrel cam followers 25 on the outer periphery of the movable barrel 15 are engaged with the movable barrel forwarding guide groove 22 on the rotatable barrel 17 and with the movable barrel cam 24 on the fixed barrel 16 (see FIG. 7) so that the movable barrel 15 moves along the optical axis 20 while it rotates.

On the other hand, the first lens cam followers 28 on the outer periphery of the first lens barrel 13 are engaged with the first lens cams 26 on the movable barrel 15 (see FIG. 8) and the forwarding guide grooves 27 on the inner periphery of the first lens barrel 13 are engaged with the forwarding guide projections 30 on the second lens barrel 14 so that the first lens barrel 13 moves forward relative to the movable barrel 15 when the movable barrel 15 rotates.

The main cam follower 46 on the outer periphery of the second lens barrel 14 is engaged with the second lens cam follower unit 29 and with the main cam groove 55 so that the second lens barrel 14 moves forward along the optical axis 20 in association with the rotation of the rotatable barrel 17.

Figure 11:
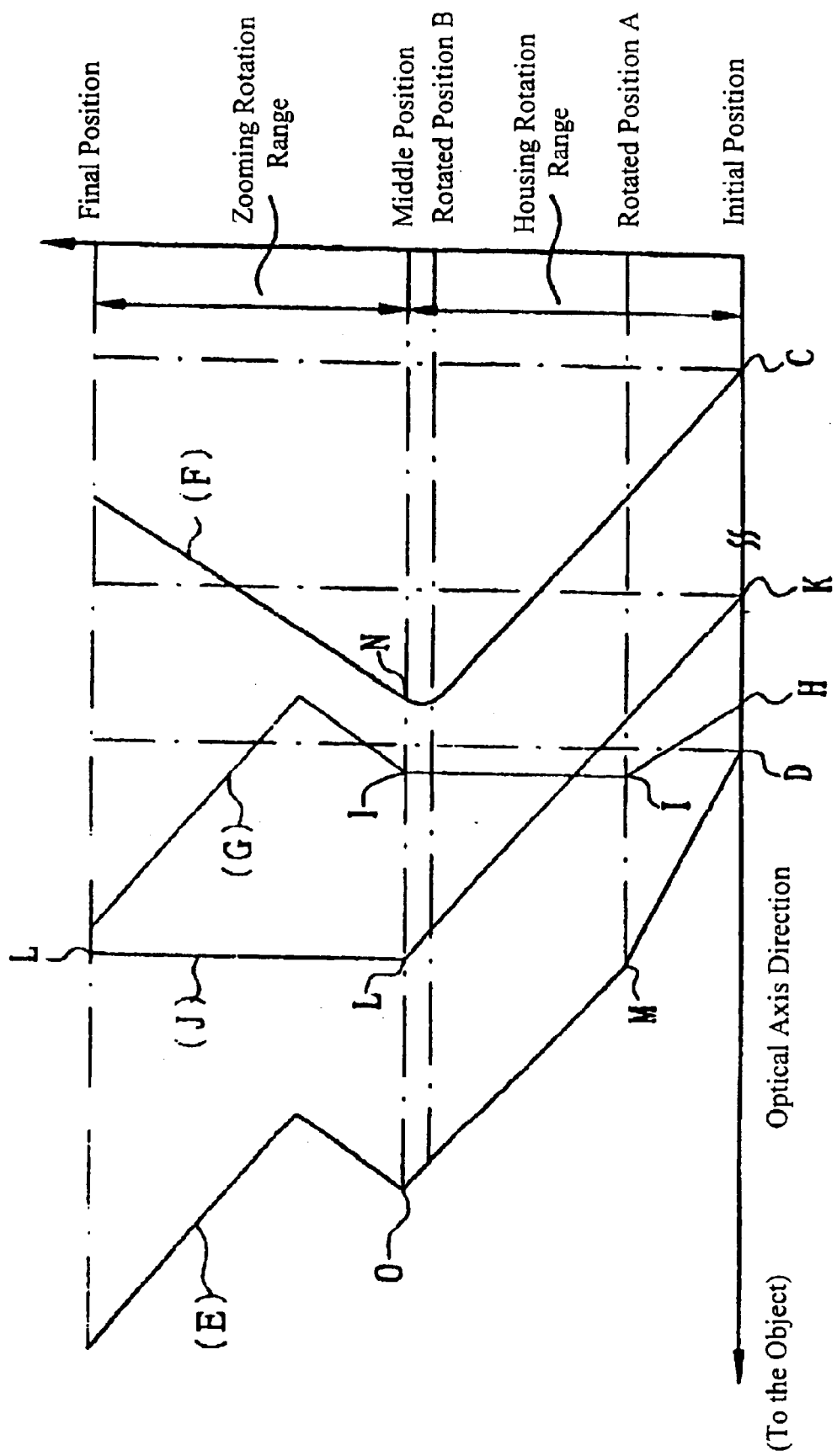
FIG. 11 is a diagram that shows the moving tracks of the first lens barrel, second lens barrel, and movable barrel of the lens device of FIG. 1.

FIG. 11 is a diagram that shows the moving tracks of the first lens barrel 13, the second lens barrel 14, and the movable barrel 15. In FIG. 11, the lines (E) and (F) represent the moving tracks of the first and second lens barrels 13 and 14, respectively, and the lines (G) and (J) represent the moving tracks of the first lens barrel 13 in relation to the second lens barrel 14 and the movable barrel 15, respectively.

When the lens device 2 is at "the initial position" (the retracted position), the second lens barrel 14 is at "the housed position C" where it is closest to the image plane and the first lens barrel 13 is at "the housed position D" where it is closest to the second lens barrel 14. While the rotatable barrel 17 rotates from "the initial position" to "the rotated position A," the first lens cam follower 28 provided on the outer periphery of the first lens barrel 13 slides in the housing preparation guide section 42 of the first lens cam 26 (see FIG. 8). Therefore, the first lens barrel 13 is reeled out, that is, extended to "the housing preparation position I" from "the sheltered position H" while the rotatable barrel 17 rotates from "the initial position" to "the rotated position A."

Meanwhile, the movable barrel cam follower 25 provided on the outer periphery of the movable barrel 15 slides in the housing guide section 40 of the movable barrel cam 24 (see FIG. 7). Therefore, the movable barrel 15 is reeled out to "the projected position L" from "the sheltered position K" on the line (J) while the rotatable barrel 17 rotates from "the initial position" to "the rotated position A." Because it is held by the movable barrel 15, the first lens barrel 13 moves along the optical axis 20 by the reeled out distance of the movable barrel 15 plus its own reeled out distance to "the housing preparation position I," which leads to a total reeled out distance of the first lens barrel 13 to the point M on the line (E).

While the rotatable barrel 17 rotates from "the rotated position A" to "the middle position," the first lens cam follower 28 provided on the first lens barrel 13 slides in the first lens movement inhibiting section 43 of the first lens cam 26 (see FIG. 8). Therefore, the first lens barrel 13 is prevented from moving along the optical axis 20 in relation to the movable barrel 15. Therefore, the first lens barrel 13 moves together with the movable barrel 15.

The second lens barrel 14 moves by the main cam follower 46 that is engaged with the main cam groove 55 (see FIG. 10) while the rotatable barrel 17 rotates from "the initial position" to "the rotated position B." When the rotatable barrel 17 reaches "the rotated position B," the second lens cam follower unit 29 enters the bent section 58b, 59b of the second lens cam unit 21 where the second lens barrel 14 turns. When the second lens cam follower 29 enters the bent section 58b, 59b, the main cam groove 55 and main cam follower 46 are disengaged and the subsidiary cam groove 54 and subsidiary cam follower 47 are engaged. Thus, at the bent sections 58b, 59b of the second lens cam unit 21, the subsidiary follower 47 and the subsidiary cam groove 54 cooperate to move the second lens barrel 14.

The subsidiary cam groove 54 has facing walls at the bent section 58b with inner surfaces of larger radii of curvature than those of the main cam groove 55. Therefore, being engaged with the bent section 58b of the subsidiary cam groove 54 having larger radii of curvature, and not with the bent section 59b of the main cam groove 55, the second lens barrel 14 is able to move more smoothly at the bent sections 58b, 59b, which also reduces the rotational load of the rotatable barrel 17.

When the rotatable barrel 17 reaches "the middle position," the lens device 2 is at the telephoto position as shown in FIG. 4. In this state, the movable barrel 15 reaches "the projected position L" relative to the fixed barrel 16. While the rotatable barrel 17 rotates from "the rotated position A" to "the rotated position B," the first lens barrel 13 does not move along the optical axis 20 in relation to the movable barrel 15 but remains at "the housing preparation position I" on the line (G). Meanwhile, the first lens barrel 13 moves along the optical axis 20 by the movement of the movable barrel 15, reaching the position O on the line (E).

The subsidiary cam follower 47 and subsidiary cam groove 54 are disengaged when the lens device 2 reaches the telephoto position. Instead, the main cam follower 46 and main cam groove 55 are engaged with each other at the boundary between the bent section 59b and the zooming guide section 57. Thus, the second lens barrel 14 is at the position N on the line (F). In this way, the first lens barrel 13 is prevented from moving relative to the movable barrel 15, and, therefore, the first lens 11 moves along the optical axis 20 only by the movement of the movable barrel 15 relative to the fixed barrel 16.

After the lens device 2 reaches the telephoto position, the rotatable barrel 17 rotates in "the zooming range." While the rotatable barrel 17 rotates in "the zooming range," the movable barrel cam follower 25 provided on the outer periphery of the movable barrel 15 slides in the movable barrel movement inhibiting section 41 (see FIG. 7). Therefore, the movable barrel 15 remains at "the projected position L."

Additionally, while the rotatable barrel 17 rotates in "the zooming range," the first lens cam follower 28 provided on the outer periphery of the first lens barrel 13 slides in the zooming guide section 44 of the first lens cam 26 (see FIG. 8). Therefore, the first lens barrel 13 moves along the optical axis 20 in relation to the movable barrel 15 by its movement in the zooming guide section 44 along the optical axis 20. In this way, while the rotatable barrel 17 rotates in "the zooming range," the movable barrel 15 is prevented from moving relative to the fixed barrel 16, and, therefore, the first lens 11 moves along the optical axis 20 by the movement of the first lens barrel 13 relative to the movable barrel 15.

Furthermore, while the rotatable barrel 17 rotates in "the zooming range," the main cam follower 46 provided on the second lens barrel 14 slides in the zooming guide section 57 of the main cam groove 55 (see FIG. 10). Therefore, the second lens barrel 14 moves along the optical axis 20 by the movement of the main cam follower 46 in the zooming guide section 57.

The first and second lens barrels 13 and 14 move along the optical axis 20 during zooming so as to change their distances from one another and from the fixed lens barrel 16. The springs 37 that bias the second lens barrel in the direction of the optical axis 20 serve to eliminate looseness between the second lens cam follower unit 29 and the second lens cam unit 21 and to correct tilting of the second lens barrel 14 relative to the fixed barrel 16. The first lens barrel 13 is prevented from rotating around the optical axis by the forwarding guide projections 30 on the second lens barrel 14 and is also pressed diametrically outward by the forwarding guide projections 30. This reduces the chance of tilting of the optical axis of the first lens 11 in relation to the optical axis of the second lens 12.

The assembly method of the lens device 2 having the structure above is described below. First, the diaphragm shutter unit 18 is mounted on the second lens frame 33 that is installed in the second lens barrel 14. The diaphragm shutter unit 18 carries the flexible printed circuit board 60 that has been previously connected to it at one end as shown in FIG. 12. As shown in FIGS. 14A and 14B, the connection part 60a at the end of the flexible printed circuit board 60 that is fixed to the diaphragm shutter unit 18 is inserted from the left into the lower through-channel 65a of the through-channel 62 formed in the second lens barrel 14. The lower through-channel 65a has nearly the same width as the connection part 60a of the flexible printed circuit board 60. Therefore, the connection part 60a is easily inserted.

Then, as shown in FIGS. 12 and 14B, the center part 60b of the flexible printed circuit board 60 is folded on the right side, that is, at the other end of the through-channel 62, at a position so as to create the folded part 60c in the center part 60b with a loop 60d. The folded part 60c is inserted into either right or left through-channel 65b or 65c of the upper tier (the right through-channel 65b is used in FIG. 14B) from the right side of the upper tier, that is, from the other end from where connection part 60a was inserted in through-channel 62.

Figure 17A:
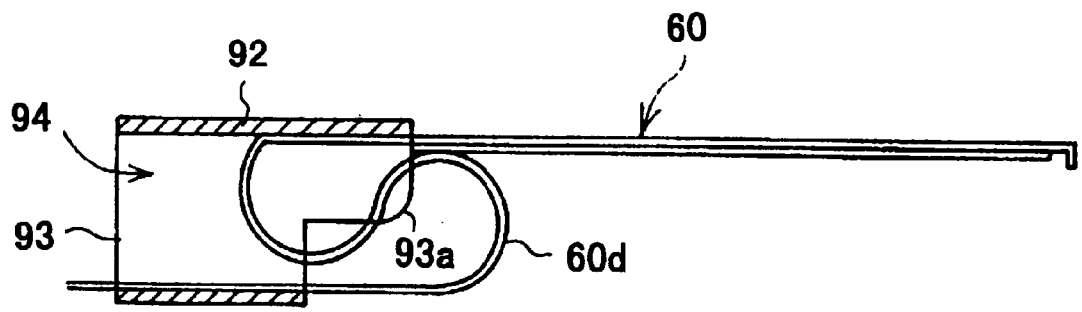
FIGS. 17A–17C show enlarged detailed views along the line B—B of FIG. 16.
Figure 17B:
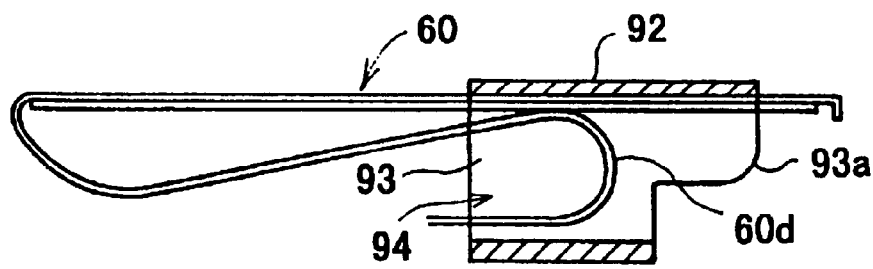
Figure 17C:
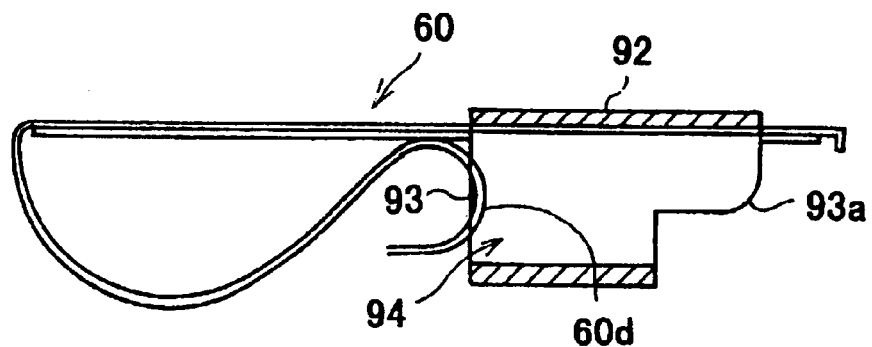

The method described above prevents the prior art problem of the loop 60d from coming out of the space 94 of the through-channel 92 as shown in FIG. 17C, which may lead to problems with the flexible printed circuit board 60. In this way, the loop 60d of the flexible printed circuit board 60 is engaged with the right end of the horizontal partition 63, that is, with the other end from where connection part 60a was inserted in through-channel 62 and, therefore, the flexible printed circuit board 60 does not come out of the through-channel 62. The through-channel 62 has the upper tier divided into two sections, each having a smaller width. Therefore, the center part 60b of the flexible printed circuit board 60 inserted in the through-channel 62 does not have crosswise play.

In FIG. 14B, two flexible printed circuit boards 60, 60 are inserted in the through-channel 62. The respective center parts 60b of the flexible printed circuit boards 60, 60 are inserted into the right and left through-channels 65b and 65c, respectively, without interfering with each other. Then, the second lens barrel 14 is fitted into the inner periphery of the first lens barrel 13. During this process, the forwarding guide projections 30 provided on the arms 38 of the second lens barrel 14 are engaged with the forwarding guide grooves 27 formed on the inner periphery of the first lens barrel 13.

Then, the first lens barrel 13 is fitted into the inner periphery of the movable barrel 15. During this process, the first lens cam follower 28 formed on the outer periphery of the first lens barrel 13 is engaged with the first lens cam 26 formed on the inner periphery of the movable barrel 15. Then, the movable barrel 15 is fitted into the inner periphery of the fixed barrel 16. During this process, the movable barrel cam follower 25 formed on the outer periphery of the movable barrel 15 is engaged with the movable barrel cam 24 formed on the fixed barrel 16, and the second lens cam follower 29 formed on the second lens barrel 14 is engaged with the second lens forwarding guide opening 23 formed on the fixed barrel 16.

Then, the fixed barrel 16 is fitted into the inner periphery of the rotatable barrel 17. During this process, the second lens cam follower unit 29 formed on the second lens barrel 14 is engaged with the second lens cam unit 21 formed on the rotatable barrel 17. Then, the part of the flexible printed circuit board 60 inserted in the through-channel 62 that is in contact with the fixed barrel 16 is fixed to the fixed barrel 16. Subsequently, the connection part 60a at the tip of the flexible printed circuit board 60 is connected and fixed to the board in the camera body.

In this way, the lens device 2 is assembled. The lens device 2 according to this embodiment uses the through-channel 62 for the flexible printed circuit board 60 that is divided by the vertical partition 64 to reduce the inner width. The connection part 60a at the tip, which is wider than the center part 60b, can be easily inserted into the through-channel 62. This facilitates the assembly process of the lens device 2 and thus improves productivity.

The through-channel 62 that has the partition 64 forms two complete channels. Therefore, no space is created above the partition 64, where the flexible printed circuit board 60 might possibly be trapped and damaged as in the prior art. The embodiment of the invention described above uses one vertical partition, or divider, 64 in the upper tier of the through-channel 62. However, multiple partitions can be used that allow the use of more flexible printed circuit board in the through-channel 62.

The upper and lower tiers are divided by the horizontal partition 63. The horizontal partition 63 and the loop 60d of the flexible printed circuit board 60 are engaged with each other. Therefore, the loop of the flexible printed circuit board will not come out of the through-channel as shown occurring in FIG. 17C. The lower through-channel 65a in the lower tier extends over the full width of the inner periphery so that the widened part 60a of the flexible printed circuit board 60 is easily inserted into it. This can reduce assembly time of the lens device 2.

The invention being thus described, it will be obvious that the same may be varied in many ways. For example, the embodiment of the invention described above applies a through-channel that is used to connect the flexible printed circuit board to the diaphragm shutter unit. However, the flexible printed circuit board could be connected to other devices. Additionally, the embodiment of the invention described above uses a second lens barrel 14 that is positioned within a first lens barrel 13. However, this can be reversed so that the first lens barrel 13 has on its outer periphery the forwarding guide grooves with which forwarding guide projections of the second lens barrel 14 can be engaged from the outside.

Furthermore, although the embodiment of the invention described above has the first lens barrel 13 provided with the forwarding grooves 27 and the second lens barrel 14 provided with the forwarding guide projections, this can be reversed and the first lens barrel 13 provided with the forwarding guide projections and the second lens barrel 14 provided with the forwarding guide grooves. Also, although the embodiment of the invention described above uses a two-group zoom lens, the invention is not limited to this. Thus, the invention is applicable to a zoom lens that includes three or more lens groups.

Furthermore, the present invention is also applicable to varifocal lenses other than zoom lenses that can be switched among telephoto, wide-angle, and retracted positions. Additionally, although the embodiment of the invention described above has the telephoto position between the retracted and wide-angle positions, the wide-angle position could be between the retracted and telephoto positions. In that case, the wide-angle position could be at the boundary between the zooming guide section and the housing guide section.

Also, although the embodiment of the invention described above uses the forwarding guide grooves 27, arms 38, and forwarding guide projections 30 provided at two different points around the optical axis 20, the forwarding guide grooves 27, arms 38, and forwarding guide projections 30 can be provided at three equally separated positions around the optical axis 20.

Additionally, as noted previously, although the embodiment of the invention described above uses one vertical partition 64 that is located precisely centrally in the upper tier of the through-channel 62, the partition might be located approximately centrally, but not precisely centrally, so as to provide different widths of through-channels for flexible printed circuit boards of different widths. Furthermore, more than one vertical partition may be used so that more flexible printed circuit boards can be connected to more devices. In that case, a vertical partition might or might not be located precisely centrally or approximately centrally of the upper tier of the through-channel 62.

Furthermore, although as shown for example in FIGS. 14A and 14B, one end of the vertical partition 64 and one end of the horizontal partition 63 are precisely aligned with one end of the through-channel 62, either one or both of the vertical partition 64 and the horizontal partition 63 could project beyond the through-channel 62 or be recessed into the through-channel 62 in locations that still provide proper isolation of a flexible printed circuit board. One end of one or both of the vertical partition 64 and the horizontal partition 63 may be located approximately at one end of the through-channel 62 or may further project beyond or be recessed in the through-channel 62.

Such variations, as described, for example, in the previous four paragraphs, are not to be regarded as a departure from the spirit and scope of the invention. Rather, the scope of the invention shall be defined as set forth in the following claims and their legal equivalents. All such modifications as would be obvious to one skilled in the art are intended to be included within the scope of the following claims.

What is claimed is:

1. A lens device for mounting a flexible printed circuit board in a lens barrel, the lens device comprising:
    a lens barrel defining an optical axis direction; and
    a through-channel on a portion of the lens barrel, said through-channel having a length direction parallel to said optical axis direction and a width direction perpendicular to said length direction, wherein said through-channel includes a first tier and a second tier adjacent to one another formed by a first partition that extends at least most of the way across the width direction of said through-channel so that said first tier extends across the width direction of said through-channel, and a second partition that is perpendicular to said first partition and which divides said second tier in the width direction so as to form separate through-channels in said second tier.

2. The lens device of claim 1, wherein said second partition divides said second tier at least approximately at the center of said through-channel in the width direction into said separate through-channels.

3. The lens device of claim 1, wherein said second partition divides said second tier precisely at the center of said through-channel in the width direction into said separate through-channels.

4. The lens device of claim 1, wherein:
    said first partition does not extend over the entire length of said through-channel;
    one end of said first partition is at least approximately aligned with one end of said through-channel in the length direction; and
    the shape of the bottom of said second partition between the other end of said first partition and the other end of said through-channel is straight or curved with no steps and connects said other end of said first partition to the top of said other end of said through-channel.

5. The lens device of claim 4, wherein one end of said second partition is at least approximately aligned with said one end of said through-channel.

6. The lens device of claim 5, wherein said one end of said first partition and said one end of said second partition are precisely aligned with said one end of said through-channel.

7. The lens device of claim 2, wherein:
    said first partition does not extend over the entire length of said through-channel;
    one end of said first partition is at least approximately aligned with one end of said through-channel in the length direction; and
    the shape of the bottom of said second partition between the other end of said first partition and the other end of said through-channel is straight or curved with no steps and connects said other end of said first partition to the top of said other end of said through-channel.

8. The lens device of claim 7, wherein one end of said second partition is at least approximately aligned with said one end of said through-channel.

9. The lens device of claim 8, wherein said one end of said first partition and said one end of said second partition are precisely aligned with said one end of said through-channel.

10. The lens device of claim 3, wherein:
    said first partition does not extend over the entire length of said through-channel;

one end of said first partition is at least approximately aligned with one end of said through-channel in the length direction; and the shape of the bottom of said second partition between the other end of said first partition and the other end of said through-channel is straight or curved with no steps and connects said other end of said first partition to the top of said other end of said through-channel.

11. The lens device of claim 10, wherein one end of said second partition is at least approximately aligned with said one end of said through-channel.

12. The lens device of claim 11, wherein said one end of said first partition and said one end of said second partition are precisely aligned with said one end of said through-channel.

13. A method of assembling a flexible printed circuit board in a lens device that includes a lens barrel defining an optical axis direction and a through-channel on a portion of the lens barrel, said through-channel having a length direction parallel to said optical axis direction and a width direction perpendicular to said length direction, wherein said through-channel includes a first tier and a second tier adjacent one another formed by a first partition that extends at least most of the way across the width direction of said through-channel so that said first tier extends across the width direction of said through-channel and a second partition perpendicular to said first partition that divides said second tier in the width direction so as to form said separate through-channels in said second tier, the method comprising the following steps:

inserting the flexible printed circuit board into said first tier from one end of said through-channel;

folding the flexible printed circuit board at the other end of said through-channel into a folded part of the flexible printed circuit board; and inserting said folded part of the flexible printed circuit board into one of said separate through-channels of said second tier from said other end of said through-channel.

14. The method of claim 13, wherein said second partition divides said second tier at least approximately at the center of said through-channel in the width direction into said separate through-channels.

15. The method of claim 13, wherein said second partition divides said second tier precisely at the center of said through-channel in the width direction into said separate through-channels.

16. The method of claim 13, wherein:

said first partition does not extend over the entire length of said through-channel;

one end of said first partition is at least approximately aligned with one end of said through-channel in the length direction; and the shape of the bottom of said second partition between the other end of said first partition and the other end of said through-channel is straight or curved with no steps and connects said other end of said first partition to the top of said other end of said through-channel.

17. The method of claim 16, wherein one end of said second partition is at least approximately aligned with said one end of said through-channel.

18. The method of claim 14, wherein:

said first partition does not extend over the entire length of said through-channel;

one end of said first partition is at least approximately aligned with one end of said through-channel in the length direction; and the shape of the bottom of said second partition between the other end of said first partition and the other end of said through-channel is straight or curved with no steps and connects said other end of said first partition to the top of said other end of said through-channel.

19. The method of claim 18, wherein one end of said second partition is at least approximately aligned with said one end of said through-channel.

20. The method of claim 15, wherein:

said first partition does not extend over the entire length of said through-channel;

one end of said first partition is at least approximately aligned with one end of said through-channel in the length direction; and the shape of the bottom of said second partition between the other end of said first partition and the other end of said through-channel is straight or curved with no steps and connects said other end of said first partition to the top of said other end of said through-channel.

* * * * *